United States Patent
Tanaka

(10) Patent No.: US 6,987,703 B2
(45) Date of Patent: Jan. 17, 2006

(54) NONVOLATILE SEMICONDUCTOR STORAGE DEVICE AND WRITE TIME DETERMINING METHOD THEREFOR

(75) Inventor: Hidehiko Tanaka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/266,942

(22) Filed: Oct. 9, 2002

(65) Prior Publication Data

US 2003/0095450 A1   May 22, 2003

(30) Foreign Application Priority Data

Oct. 9, 2001   (JP) .............................. 2001-311575

(51) Int. Cl.
*G11C 7/00*   (2006.01)
(52) U.S. Cl. .................................. 365/226; 365/230.06
(58) Field of Classification Search ................ 365/226, 365/230.06, 196, 185.24, 189.04, 189.07
See application file for complete search history.

(56) References Cited

U.S. PATENT DOCUMENTS

| | | | | |
|---|---|---|---|---|
| 4,443,718 A | * | 4/1984 | Hagiwara et al. ...... | 365/185.06 |
| 4,853,898 A | * | 8/1989 | Hashemi et al. ....... | 365/189.11 |
| 5,608,667 A | * | 3/1997 | Osawa ........................ | 365/145 |
| 5,808,936 A | * | 9/1998 | Nakayama ............. | 365/185.18 |
| 5,835,400 A | * | 11/1998 | Jeon et al. .................. | 365/145 |
| 6,006,347 A | * | 12/1999 | Churchill et al. ........... | 365/201 |
| 6,188,603 B1 | * | 2/2001 | Takeda ................... | 365/185.09 |
| 6,256,224 B1 | * | 7/2001 | Perner et al. ................ | 365/173 |
| 6,519,184 B2 | * | 2/2003 | Tanaka et al. ......... | 365/185.22 |
| 6,621,745 B1 | * | 9/2003 | Manea .................. | 365/185.23 |

FOREIGN PATENT DOCUMENTS

| | | |
|---|---|---|
| JP | 07-073685 | 3/1995 |
| JP | 10-177795 | 6/1998 |
| JP | 11-039887 | 2/1999 |
| JP | 11-073786 | 3/1999 |
| JP | 11-096785 | 4/1999 |
| JP | 2000-113686 | 4/2000 |
| JP | 2000-123584 | 4/2000 |

* cited by examiner

*Primary Examiner*—Thong Q. Le
(74) *Attorney, Agent, or Firm*—Morrison & Foerster LLP

(57) ABSTRACT

A flash memory constructed of a plurality of memory cells $M_{11}, \ldots, M_{n3}$ selected by the outputs of an X-decoder 1 and a Y-decoder 2 for generating a row address and a column address is provided with a measurement use write pulse generator circuit 7, which simultaneously supplies write signals of different pulse widths to the memory cells on an identical column, and a select circuit 5, which switches over so as to supply the write signals from the measurement use write pulse generator circuit 7 to the word lines $M_{11}, \ldots, M_{n1}$ on the identical column during pulse width measurement and supply the word line signal from the X-decoder 1 to the corresponding one word line WL1 during normal access. According to this flash memory, the total write time can be reduced by reducing the frequency of repetition of write and verify.

17 Claims, 5 Drawing Sheets

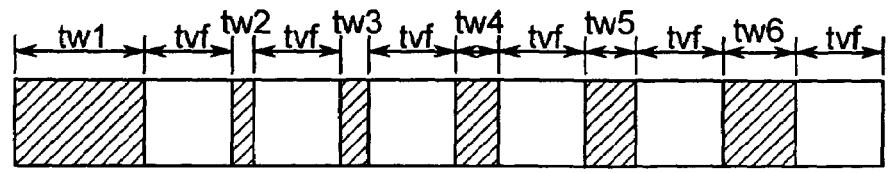
*Fig.1A*
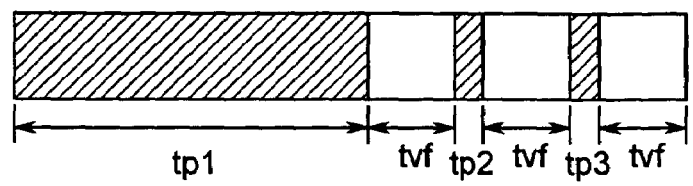
*Fig.1B*
*Fig.7*
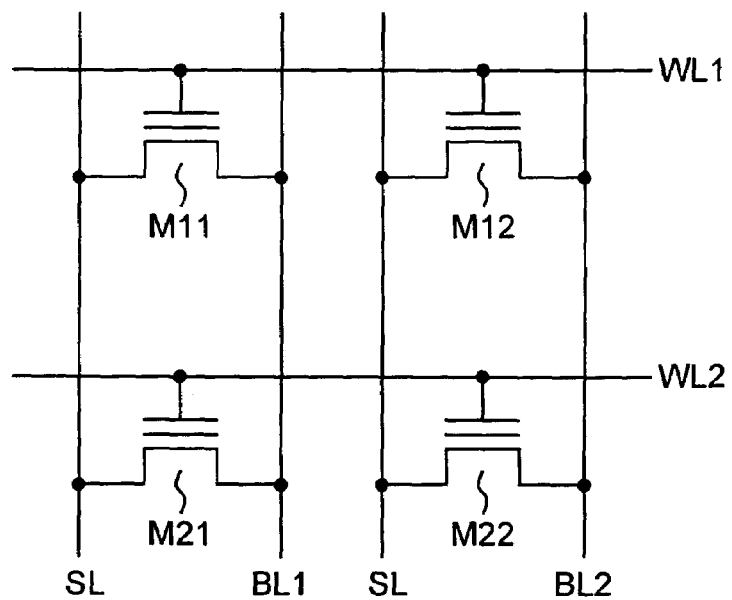

NONVOLATILE SEMICONDUCTOR STORAGE DEVICE AND WRITE TIME DETERMINING METHOD THEREFOR

BACKGROUND OF THE INVENTION

The present invention relates to a nonvolatile semiconductor storage device, whose threshold voltage is electrically controlled to store data.

Nonvolatile semiconductor storage devices, such as EEPROM and flash EEPROM, which have floating gates and are electrically rewritable, execute data write and erase by raising and lowering the memory cell threshold voltage Vth with electrical charges injected into or extracted from the floating gates.

FIG. 7 is a circuit diagram showing part of the memory cell array of a conventional nonvolatile semiconductor storage device. This memory cell array is constructed of memory cells $M_{11}$, $M_{12}$, $M_{21}$, $M_{22}$ arranged in a matrix form. The memory cells $M_{11}$, $M_{12}$; $M_{21}$, $M_{22}$, which are located on same rows, are connected respectively to word lines $WL_1$; $WL_2$, which share a common control gate. The memory cells $M_{11}$, $M_{21}$; $M_{12}$, $M_{22}$, which are located on same columns, are connected respectively to bit lines $BL_1$; $BL_2$, which share a common drain. Moreover, the sources of all the memory cells $M_{11}$, $M_{12}$, $M_{21}$, $M_{22}$ are connected to a common source line SL.

When erasing data in the aforementioned memory cell array, a negative voltage of, for example, −10 V is applied to the word lines $WL_1$ and $WL_2$, a positive voltage of, for example, 5 V is applied to the source line SL, and the bit lines $BL_1$, $BL_2$ are put into a high impedance state. Then, in the memory cells $M_{11}$, $M_{12}$, $M_{21}$, $M_{22}$, electrons are discharged from the floating gate to the source due to an FN tunneling effect, and the threshold voltage is lowered to attain an erase state.

On the other hand, when writing data, a positive high voltage of, for example, 12 V is applied to the word line connected to the selection memory cell to be subjected to write, and the other word lines are grounded. A positive voltage of, for example, 6 V is applied to the bit line connected to the selection memory cell for a prescribed time, and the other bit lines are grounded. Then, in the selection memory cell, electrons (hot electrons) are injected into the floating gate from a channel region formed between the source and drain diffusion layers, and the threshold voltage rises to attain a written state in which data are stored.

In general, the threshold voltage during write is set at a prescribed value by repetitively applying a write pulse of a constant pulse width to the bit line connected to the selection memory cell, thereafter detecting the threshold voltage of the selection memory cell by means of a sense circuit and ending the write operation when the detected threshold voltage falls within a prescribed range.

The threshold voltage of the memory cell has a tendency to change in proportion to the logarithmic value of the width of the pulse applied to the memory cell. If the write pulse of same pulse width is repetitively applied, then the change in the threshold voltage of the memory cell saturates and gradually reduces. Accordingly, there is a problem that the write pulse applying frequency is required to be increased to change the threshold voltage up to the prescribed threshold voltage Vth and the write time becomes long. Moreover, write and verify are repetitively executed since each write is followed by the so-called verify operation for confirming whether or not the threshold voltage has reached the prescribed value consuming a prescribed time, and this leads to a further problem that a total time required for the write becomes long if the write pulse applying frequency is increased.

Furthermore, in the case of a multi-valued memory, a low operating voltage memory or the like, the distribution width of the required threshold voltage is narrow. Therefore, if it is attempted to restrain the threshold value distribution, the pulse width at one time becomes small. Therefore, the write is required to be executed by applying the pulse many times in order to attain the required threshold value, and this leads to a long write time.

Accordingly, the following prior art examples have been proposed as a technique for narrowing the threshold voltage distribution without increasing the write time.

According to Japanese Patent Laid-Open Publication Nos. HEI 7-73685 and HEI 11-73786, the frequency of applying the write pulse is reduced by increasing the write pulse width in accordance with an increase in the frequency of repetition.

In Japanese Patent Laid-Open Publication No. HEI 10-177795, the write time is shortened by increasing the pulse width at a prescribed rate of increase until the threshold voltage reaches a prescribed range inclusive of the target value, reducing the rate of increase in the pulse width after the threshold voltage reaches the prescribed range and repetitively applying the pulse until the threshold voltage reaches the target value Vth or its neighborhood.

According to Japanese Patent Laid-Open Publication No. HEI 11-39887, the ISPP (Incremental Step Pulse Programming) method of changing the level of a voltage applied to the selection memory cell as the frequency of write increases is improved to apply a write pulse of a large width at the first time and apply a pulse, which has a small width and of which the voltage level gradually increases as the frequency of write increases, at the second and subsequent times.

Furthermore, Japanese Patent Laid-Open Publication Nos. HEI 11-96785, 2000-113686 and 2000-123584 propose the methods of determining the memory cell characteristics, setting the pulse width or the pulse voltage of the write pulse optimum for the memory cell characteristics and applying a write pulse optimum for each memory cell. According to Japanese Patent Laid-Open Publication No. HEI 11-96785, on the basis of an A*2B pulse width system obtained by improving an exponential power pulse write system set so that the write time at the first time is comparatively long and a cumulative write time increases at a ratio of exponential power at the second and subsequent times, the value of A and the value of B (<1) can be adjusted according to the memory cell characteristics.

Moreover, the cumulative write time is reduced by adopting the power pulse write system when an overhead time including a verify time is sufficiently longer than one write time and adopting a uniform pulse write system when the overhead time is sufficiently shorter than one write time.

The conventional methods, which are described in the preceding two paragraphs and reduce the write time by changing the write pulse width or pulse voltage in order to complete the write within the smallest possible number of times, have the problems as follows.

That is, the prior art example of Japanese Patent Laid-Open Publication No. HEI 11-39887 discloses the change in the pulse width or the pulse voltage of the write pulse, but the method discloses no concrete write pulse width determining method.

According to Japanese Patent Laid-Open Publication No. HEI 11-96785, the pulse width or the pulse voltage of the write pulse optimum for the memory cell M characteristics is set, and the various parameters of an initial value, a modulo value and so on for setting the write pulse width are set in the fuse array. However, there is described neither a concrete method nor a procedure regarding how to set the write pulse width in this fuse array according to the characteristic variations of the memory cells.

According to Japanese Patent Laid-Open Publication No. 2000-113686, the write pulse of a prescribed width is applied to each memory cell before the write operation, and the change in the threshold value is measured to determine the practical write pulse width. However, erase is needed again to bring each memory cell back into the original state, and the write time eventually becomes long. Moreover, the write characteristic of a sample for evaluation is used to set the pulse width of the write pulse optimum for the memory cell characteristics. However, no measuring method of the write characteristic is concretely disclosed.

Japanese Patent Laid-Open Publication No. 2000-123584 describes the correction of the write voltage according to the memory cell characteristics. However, since no quantitative correction method is disclosed, the quantity of correction cannot help being determined according to the read result after write, and the superfluous processing of determining the quantity of correction is added, resulting in increasing the write time.

As described above, the prior art technologies do not always intend to attain the target threshold value with the first-time write pulse. Moreover, the conventional method of repeating the write and verify many times with a short pulse has had the problem that an error between the cumulative write time and the write time when write is executed with one pulse at one time has been large.

SUMMARY OF THE INVENTION

Accordingly, the present invention has the object of reducing the write time and achieves the object by bringing the threshold value to the target threshold value with the longest possible pulse at first-time write according to the memory cell characteristics and, if the target threshold value is not attained at the next verify, thereafter finely adjusting the threshold value with a comparatively short pulse. According to this method, it becomes most important to accurately obtain the first-time write pulse width.

For the above purpose, the present invention provides a measuring method for obtaining a write pulse width needed for further changing the threshold value from a certain threshold value, accurately bringing the threshold value close to the target threshold value by the first-time write with the pulse width defining a distinct concrete write pulse width.

In order to achieve the above object, there is provided a nonvolatile semiconductor storage device having an X-decoder for generating a row address for selecting a word line, a Y-decoder for generating a column address for selecting a bit line, and a plurality of memory cells to be selected via the word line and the bit line by outputs of the X-decoder and the Y-decoder, the device comprising:

a pulse generator circuit for supplying a plurality of pulse signals of different pulse widths to a plurality of word lines; and a select circuit for selecting an output from the pulse generator circuit or the output from the X-decoder to supply a signal for driving the word lines.

Also, there is provided a nonvolatile semiconductor storage device having an X-decoder for generating a row address for selecting a word line, a Y-decoder for generating a column address for selecting a bit line, and a plurality of memory cells to be selected via the word line and the bit line by outputs of the X-decoder and the Y-decoder, the device comprising:

a pulse generator circuit for generating a plurality of pulse signals of different pulse widths in accordance with same timing; and a select circuit for selecting an output from the pulse generator circuit or the output from the Y-decoder to select bit lines.

Also, there is provided a write signal pulse width measuring method for a nonvolatile semiconductor storage device that has a plurality of memory cells in which threshold voltages are controlled by executing transfer of electric charges to and from a charge storage layer with a write signal or an erase signal comprised of a plurality of pulses applied and data corresponding to the threshold voltages are retained, the method comprising:

a first step for setting all the threshold values of a memory cell group comprised of at least part of the plurality of memory cells to a prescribed first threshold value;

a second step for giving write pulses of different pulse widths to the memory cell group; and a third step for reading individual data of the memory cell group and comparing a current during read with a reference current corresponding to a second threshold value for determination of a relation of threshold magnitude with respect to the second threshold value.

Also, there is provided a pulse width determining method using the write signal pulse width measuring method claimed in claim 7, wherein the determination of the relation of magnitude in the third step is achieved by comparing the read current with the reference current in an ascending order of the pulse width of the applied write signal, and when there is a pulse width of first inversion case of the relation of magnitude or a plurality of inversion cases of the relation of magnitude, determining either one of pulse widths that range from the pulse width of the first inversion case to the pulse width of the last inversion case as a pulse width of a write signal optimum for write operation.

Also, there is provided a write method for a nonvolatile semiconductor storage device that has a plurality of memory cells in which threshold voltages are controlled by executing transfer of electric charges to and from a charge storage layer with a write signal or an erase signal comprised of a plurality of pulses applied and data corresponding to the threshold voltages are retained, wherein the pulse width determined by the pulse width determining method claimed in claims 12 is made to be a pulse width of a write signal to be applied first during write operation.

Also, there is provided a write method for a nonvolatile semiconductor storage device that has a plurality of memory cells in which threshold voltages are controlled by executing transfer of electric charges to and from a charge storage layer with a write signal or an erase signal comprised of a plurality of pulses applied and data corresponding to the threshold voltages are retained, wherein a value obtained by multiplying the pulse width determined by the pulse width determining method claimed in claims 12 by a positive coefficient smaller than one is made to be a pulse width of a write signal to be applied first during write operation.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1A and 1B are timing charts qualitatively showing a nonvolatile semiconductor storage device write method of the present invention in comparison with a conventional write method;

FIG. 7 is a circuit diagram showing part of the memory cell array of a conventional nonvolatile semiconductor storage device.

DETAILED DESCRIPTION OF THE PREFERRED EMBODIMENTS

Figure 2:
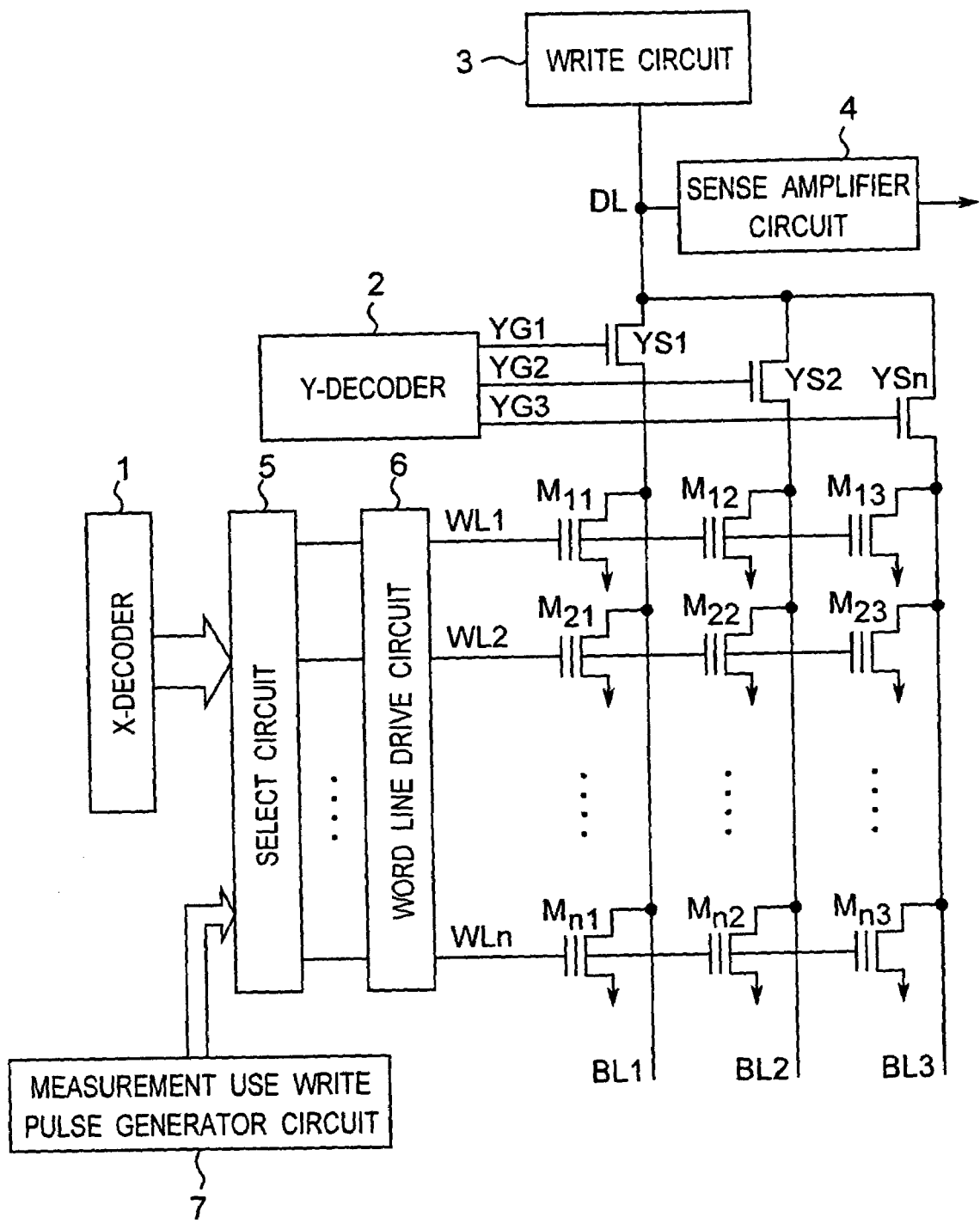
FIG. 2 is a circuit diagram of a flash memory according to a first embodiment of the nonvolatile semiconductor storage device of the present invention.

FIGS. 1A and 1B are timing charts qualitatively showing a nonvolatile semiconductor storage device write method of the present invention in comparison with a conventional write method.

FIG. 1A shows the write operation disclosed in the prior art example of Japanese Patent Laid-Open Publication No. HEI 11-96785, which executes write for a comparatively long time tw1 at the first time, thereafter executes verify for a time tvf and repeats the write operation and the verify operation one after another. At the second and subsequent write times tw2, tw3, tw4, . . . , the cumulative write time is gradually increased at a ratio of exponential power, while the verify time tvf is kept constant. Then, during the verify operation after the write at the sixth time tw6, it is confirmed that the target threshold value is attained, and the write operation ends. The fact that the cumulative write time is increased at a ratio of exponential power means that the equation:

$$tw2/tw1 = tw3/(tw1+tw2) = tw4/(tw1+tw2+tw3) = tw5/(tw1+tw2+tw3+tw4) = tw6/(tw1+tw2+tw3+tw4+tw5)$$

holds, and the total write time becomes $$tw1+tw2+tw3+tw4+tw5+tw6+tvf \times 6.$$

In contrast to this, as shown in the timing chart of FIG. 1B, the write operation, which is one example of the method mentioned in the claim 16 of the present invention, executes write for a comparatively long time tp1 at the first time, thereafter executes verify for a time tvf. At the second and subsequent times, the write operation executed for a short time tp2, tp3 (<<tp1) and the verify operation executed for a fixed time tvf are alternately repeated. The target threshold value is already attained by a third-time verify operation, and the write operation ends. The first write time tp1 has a value close to the total write time of tw1+tw2+tw3+tw4+tw5+tw6 of FIG. 1A. However, since the write and verify are repeated only three times, it can be understood that the total write time tp1+tp2+tp3+tvf×3 can be remarkably reduced in comparison with the total write time of FIG. 1A.

By executing the first-time write during the time tp1 in the memory cell, the threshold value of the memory cell is changed from the initial value to the neighborhood of the target value by a prescribed width. Even if the width of change is same, the required frequency of write and the total write time vary when the initial threshold value is varied. The greater the width of change is, the further the write time required for the change is exponentially increased. Accordingly, with regard to each memory cell of the memory cell array that constitutes the nonvolatile semiconductor storage device, it is required to obtain a write time necessary for changing the threshold value from the initial value by the prescribed width through measurement by a prescribed method in the fabricating stage or the like before the device is practically used and determine the required write time, i.e., the appropriate first-time write pulse width tp1 from the pulse width of the write signal. The pulse width measuring method and the pulse width determining method of the write signal, as mentioned in the claims 6 and 11, will be described with reference to FIG. 3.

FIG. 2 is a circuit diagram of a flash memory according to one embodiment of the nonvolatile semiconductor storage device mentioned in the claim 1. This flash memory is provided with a plurality of memory cells $M_{11}$, $M_{21}$, $M_{31}$, . . . , $M_{n1}$, $M_{n2}$, $M_{n3}$ arranged in a matrix form, bit lines BL1; BL2; BL3 that connect the drains of the memory cells $M_{11}$, $M_{12}$, . . . , $M_{n1}$; . . . ; $M_{13}$, $M_{23}$, . . . , $M_{n3}$ located on an identical column to one another, column select transistors YS1, YS2, YS3 interposedly provided at one end of the bit lines, a Y-decoder 2 that decodes the externally inputted address signal into a column select signal and outputs the resulting signal to the gates of the corresponding column select transistors YS1, YS2, YS3, a write circuit 3 and a sense amplifier 4 whose output terminal and input terminal are connected to a data line DL connected in common with the drains of the column select transistors YS1, YS2, YS3, word lines WL1; WL2; WLn that connect the control gates of the memory cells $M_{11}$, $M_{12}$, $M_{13}$; . . . ; $M_{n1}$, $M_{n2}$, $M_{n3}$ located on an identical row to one another, and an X-decoder 1 that decodes the externally inputted address signal into a word line signal during normal memory access and outputs the resulting signal to the corresponding word lines WL1, WL2, . . . , WLn via a select circuit 5 and a word line drive circuit 6 described later.

The flash memory is further provided with a measurement use write pulse generator circuit 7 that serves as a pulse generator circuit for generating a plurality of pulse signals of different pulse widths mentioned in the claim 1 in accordance with same timing and a select circuit 5 for selecting either one of the outputs of this measurement use write pulse generator circuit 7 and the X-decoder 1.

The measurement use write pulse generator circuit 7 is a circuit for outputting a plurality of word line signals at the same time when measuring the pulse width of the write signal dissimilarly to the construction of the ordinary flash memory. The select circuit 5 outputs to the word line drive circuit 6 a plurality of word line signals of different pulse widths inputted parallel from the measurement use write pulse generator circuit 7 when measuring the pulse width and outputs only one word line signal inputted from the X-decoder 1 to the word line drive circuit 6 during the normal memory access.

Figure 3:
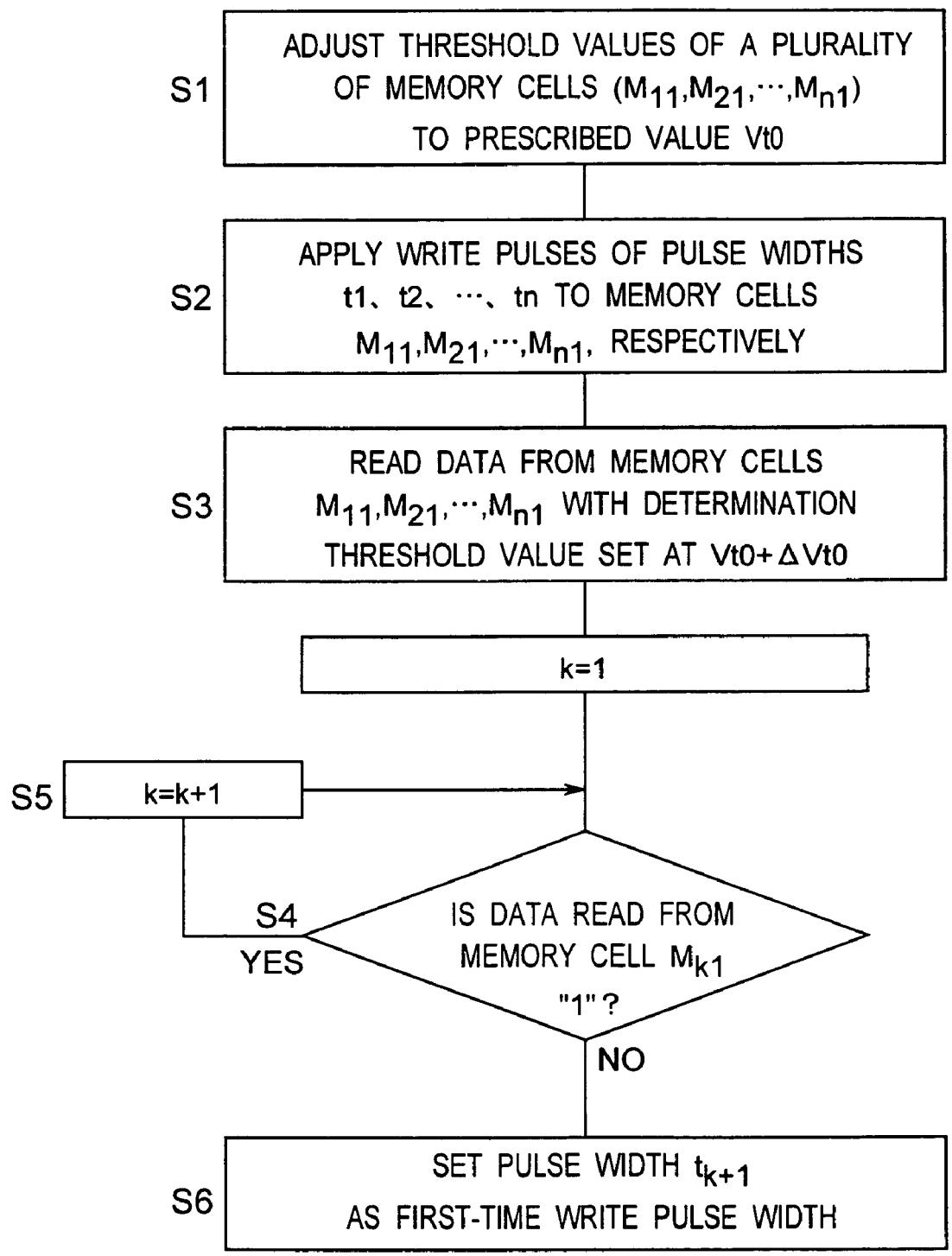
FIG. 3 is a flowchart showing the processing flow of one embodiment of the pulse width measuring method and the pulse width determining method of the present invention.

FIG. 3 is a flowchart showing one embodiment of the pulse width determining method that uses the write signal pulse width measuring method mentioned in the claim 6 and the measuring method mentioned in the claim 11.

The processing flow roughly includes the processes of adjusting the threshold values of the memory cells $M_{11}$, $M_{21}, \ldots, M_{n1}$ located on an identical column of the flash memory to a fixed value Vt0 in step S1, applying write pulses of different pulse widths t1, t2, ..., tn to the memory cells $M_{11}, M_{21}, \ldots, M_{n1}$ in step S2, reading the data stored in the memory cells with the determination use threshold value set at Vt0+ΔVt0 in step S3 and determining the width of the write pulse applied to the memory cell, in which the determination result of the read data by the determination use threshold value is inverted for the first time, as the first-time write pulse width in steps S4 through S6.

The above-mentioned processing flow will be described in detail as follows.

In order to adjust the threshold values of the memory cells $M_{11}, M_{21}, \ldots, M_{n1}$ located on an identical column to the fixed value Vt0 in step S1, it is detected whether a read current from each memory cell is larger or smaller than a current value corresponding to the value Vt0 by means of the sense amplifier circuit 4. The operation of extracting electrons from the floating gate of the memory cell when the read current is larger and injecting electrons into the floating gate of the memory cell when the read current is smaller is repeated until the threshold value comes to have the fixed value Vt0. Although this technique is known by, for example, Japanese Patent Laid-Open Publication No. HEI 11-144477, the operation can also be executed by another technique.

Figure 4:
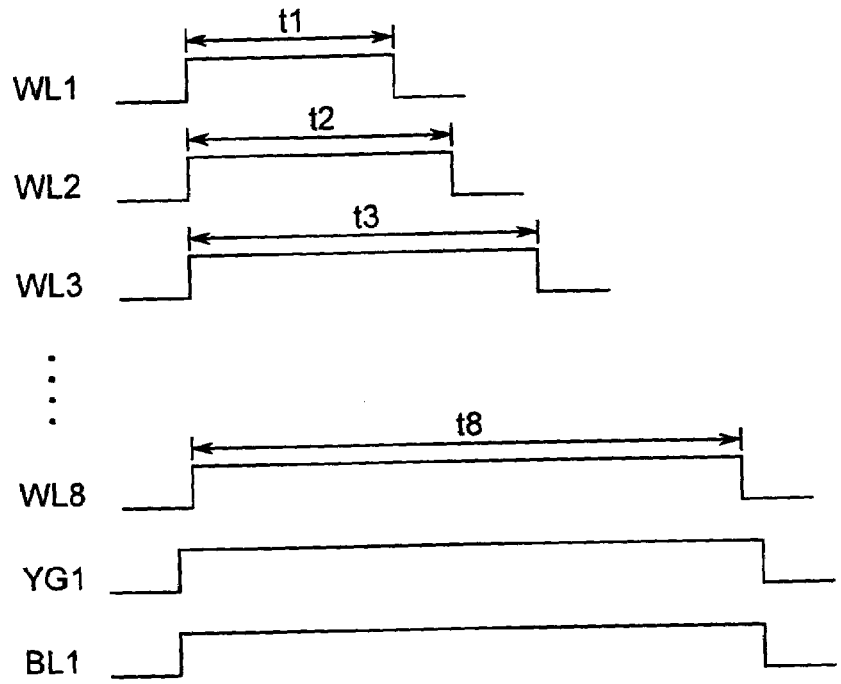
FIG. 4 is a signal timing chart of the write operation of the first embodiment.

When the write pulses of different pulse widths are applied to the memory cells $M_{11}, M_{21}, \ldots, M_{n1}$ with the setting of, for example, n=8 in step S2, as shown in the timing chart of FIG. 4, word line signals WL1, WL2, ..., WL8 (a positive high voltage of 12 V, for example) of different pulse widths t1, t2, ..., t8 are applied to the control gates of the memory cells $M_{11}, M_{21}, \ldots, M_{n1}$ from the measurement use write pulse generator circuit 7 via the select circuit 5 and the word line drive circuit 6 of FIG. 2. A column select signal YG1 is applied from the Y-decoder 2 to the gate of a column select transistor YS1 of the selected column, and the bit line signal BL1 (a positive voltage of 6 V, for example) is applied from the write circuit 3 of FIG. 2 to the bit line BL1 of the selected column via the data line DL. As is apparent from FIG. 4, the word line signals WL1, WL2, ..., WL8 rise in voltage at the same time, whereas the pulse width is gradually increased according to a relation of t1<t2< ... <t8.

The reason why the word line signals WL1, WL2, ..., WL8 are made to rise in voltage at the same time is to efficiently execute write in the memory cell on the identical column within a short time. Since a large write current is needed for the above operation, it is preferable to externally supply the write current. It is to be noted that the word line signals are not necessarily required to rise at the same time.

Moreover, when the exponential power pulse system is used for the setting of the write pulse width, the aforementioned pulse width is in accordance with a relation of t2/t1=t3/t2= ... =t8/t7.

The verify operation in step S3 is to convert a current flowing through the bit line BL1 into a voltage by means of a resistor element (not shown) when the determination use threshold value is set at Vt0+ΔVt0, the column select transistor YS1 of the selected column is made conductive by means of the Y-decoder 2 of FIG. 2, a power voltage is supplied to the bit line BL1, and the word lines WL1, WL2, ..., WLn are successively raised in voltage by the word line signals from the X-decoder 1, compare the resulting voltage with a reference voltage corresponding to the determination use threshold value Vt0+ΔVt0 and output the result of comparison from the sense amplifier circuit 4.

Table 1 shows one example of the data outputted from the sense amplifier circuit 4 that detects each current flowing through the data line DL when the memory cells $M_{11}$, $M_{21}, \ldots, M_{81}$ are successively made conductive by the word line signals.

TABLE 1

| Memory Cell | $M_{11}$ | $M_{21}$ | $M_{31}$ | $M_{41}$ | $M_{51}$ | $M_{61}$ | $M_{71}$ | $M_{81}$ |
|---|---|---|---|---|---|---|---|---|
| Data | "1" | "1" | "1" | "1" | "0" | "0" | "0" | "0" |
| Pulse Width | t1 | t2 | t3 | t4 | t5 | t6 | t7 | t8 |

In Table 1, the data "1" represents the fact that a current flows and the memory cell is in the unwritten state in which the threshold voltage is low, while the data "0" represents the fact that no current flows and the memory cell is in a written state in which the threshold voltage is high. Table 1 shows that the memory cell $M_{51}$ that has undergone write with a pulse width t5 and subsequent cells have reached the determination use threshold value.

This corresponds to the operation as follows. It is determined whether or not the data read from the memory cell $M_{k1}$ (1≦k≦8) is "1" in steps S4 and S5 of the flowchart of FIG. 3. When the written state, which is represented by "0" counter to "1", is initially attained, the write pulse width of the memory cell is made to be the first-time write pulse width tp1 described with reference to FIG. 1B in step S6.

TABLE 2

| Memory Cell | $M_{11}$ | $M_{21}$ | $M_{31}$ | $M_{41}$ | $M_{51}$ | $M_{61}$ | $M_{71}$ | $M_{81}$ |
|---|---|---|---|---|---|---|---|---|
| Data | "1" | "1" | "1" | "1" | "0" | "1" | "1" | "0" |
| Pulse Width | t1 | t2 | t3 | t4 | t5 | t6 | t7 | t8 |

Table 2 shows another example of data outputted from the sense amplifier 4 of the memory cells $M_{11}, M_{21}, \ldots, M_{81}$ during the verify operation. The data "1" that represents the unwritten state is outputted from the memory cells $M_{11}$ through $M_{41}$. The data "0" that represents the written state is outputted once from the memory cell $M_{51}$. Subsequently, the data "1" of the unwritten state is outputted again from the memory cells $M_{61}$ and $M_{71}$, and the data "0" of the written state is outputted from the last memory cell $M_{81}$.

This meant that the memory cell $M_{51}$ was the easily written cell due to the characteristic variations of the memory cells and therefore the memory cells $M_{61}$ and $M_{71}$ written with the pulse width t6 and t7 longer than the pulse width t5 precedently entered the written state despite the fact that the cells were in the unwritten state.

Therefore, it is acceptable to set the first-time write pulse width at t8. However, if the other memory cells located on the identical column are written with the pulse width t8, there might appear cells of which the threshold value considerably exceeds the target threshold value. Then, there occurs a problem that an erase operation, which takes the erase characteristics of the memory cells into consideration, is needed, resulting in increasing the total write time. Accordingly, the first-time write pulse width for changing the threshold values of the memory cells $M_{11}, M_{21}, \ldots, M_{n1}$ located on the identical column from the initial fixed threshold value Vt0 by ΔVt0 is set at t5. In general, the minimum value of the write pulse width, with which the data "0" is outputted, is used as the first-time write pulse width.

However, a value k×t5 obtained by multiplying the minimum value of the pulse width by a coefficient k that is smaller than one is practically used as the first-time write pulse width as mentioned in the claim 17. This is because the threshold value must be lowered by the erase operation if the threshold value too much exceeds the target threshold value by the first-time write. If the distribution of the memory cell write characteristics is previously known in detail through an experiment or the like, then the above-mentioned coefficient can be accurately statistically determined.

The measurement and determination of the first-time write pulse width described above can be executed normally in the fabricating and inspecting stages before the shipping of the nonvolatile semiconductor storage device as mentioned in the claim 14 or in the initialization stage after the shipping of the device as mentioned in the claim 15 or in the power-up stage of the device as mentioned in the claim 16.

Executing the measurement and determination before the shipping of the device has an advantage that the device can be used similarly to the ordinary flash memory. Executing the measurement and determination after the shipping of the device has an advantage that the write time optimized to the practical use conditions of power voltage, temperature, memory cell characteristic deterioration due to aging and so on.

During the write operation described in step S2 of FIG. 3, same word line signals WL1, WL2, . . . , WLn are simultaneously applied also to the memory cells connected to other bit lines $BL_2$, $BL_3$ by simultaneously making the other column select transistors YS2, YS3 of FIG. 2 conductive, and the number of samples for determining the write pulse width is increased by executing write in the same amount of time as in the memory cells $M_{11}$, $M_{21}$, . . . , $M_{n1}$ of the first column. As a result, measurement results of higher accuracy can be statistically obtained.

That is, by executing write in the memory cells $M_{12}$, $M_{22}$, . . . , $M_{n2}$ in the same amount of time as in the memory cells $M_{11}$, $M_{21}$, . . . , $M_{n1}$, making the column select transistor YS2 conductive in the subsequent verify operation and detecting the current from the memory cells $M_{12}$, $M_{22}$, . . . , $M_{n2}$ flowing through the bit line BL2 by means of the sense amplifier 4 when the word lines WL1, WL2, WLn are successively raised in voltage, the write time for changing the threshold value of each memory cell of the second column by $\Delta Vt0$ from the fixed value Vt0 can be obtained as additional data. Furthermore, by executing the same operation on the memory cells $M_{13}$, $M_{23}$, . . . , $M_{n3}$ of the third column, a first-time write pulse width of higher reliability can be obtained on the basis of the write time data of these three sets.

Figure 5:
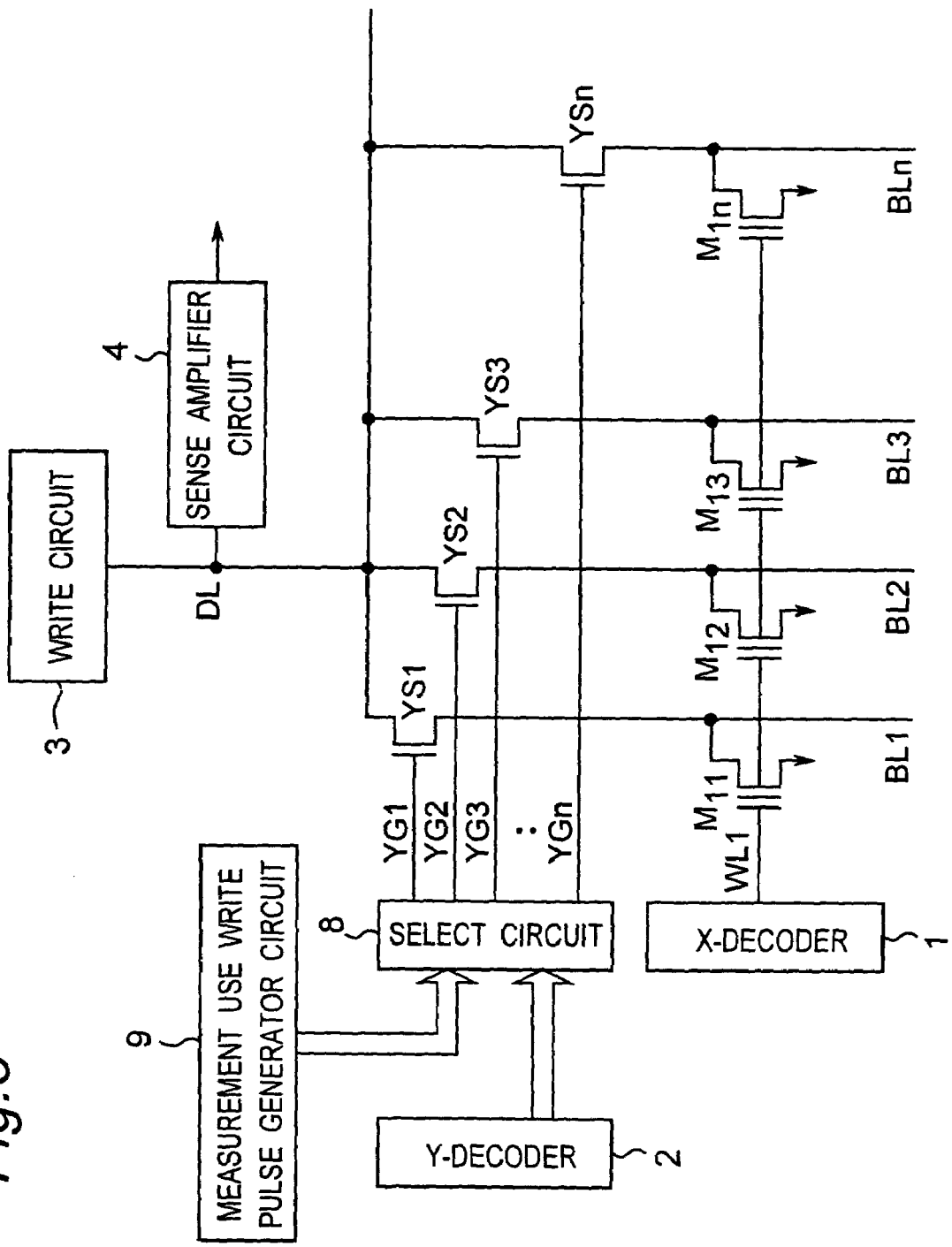
FIG. 5 is a circuit diagram of a flash memory according to a second embodiment of the nonvolatile semiconductor storage device of the present invention.

FIG. 5 shows a flash memory according to one embodiment of the nonvolatile semiconductor storage device mentioned in the claim 3 of the present invention. This flash memory has the same construction as that of the flash memory of FIG. 2 except that the measurement use write pulse generator circuit 7 and the select circuit 5 of the flash memory described with reference to FIG. 2 are shifted from the X-decoder 1 side to the Y-decoder 2 side.

The above-mentioned flash memory is provided with a plurality of memory cells $M_{11}$, $M_{12}$, $M_{13}$, . . . , $M_{1n}$ arranged in a matrix form, bit lines BL1; BL2; BL3; . . . ; BLn that connect the drains of the memory cells $M_{11}$, . . . ; $M_{12}$, . . . ; $M_{13}$, . . . ; $M_{1n}$, . . . located on an identical column to one another, column select transistors YS1, YS2, YS3, . . . , YSn interposedly provided at one end of the bit lines, a Y-decoder 2 that decodes the externally inputted address signal into a column select signal and outputs the resulting signal during normal memory access and outputs the resulting signal to the gates of the corresponding column select transistors YS1, YS2, YS3, . . . , YSn via a select circuit 8, a write circuit 3 and a sense amplifier 4 whose output terminal and input terminal are connected to a data line DL connected in common with the drains of the column select transistors YS1, YS2, YS3, . . . , YSn, word lines WL1; . . . that connect the control gates of the memory cells $M_{11}$, $M_{12}$, $M_{13}$, . . . $M_{1n}$; . . . located on the identical row to one another, and an X-decoder 1 that decodes the externally inputted address signal into a word line signal and outputs the resulting signal to the corresponding word lines WL1, . . .

The flash memory is further provided with a measurement use write pulse generator circuit 9 that serves as a pulse generator circuit for generating a plurality of pulse signals of different pulse widths mentioned in the claim 3 in accordance with the same timing and a select circuit 8 for selecting either one of the outputs of this measurement use write pulse generator circuit 9 and the Y-decoder 2.

The measurement use write pulse generator circuit 9 is a circuit for outputting a plurality of column select signals at the same time when measuring the pulse width of the write signal dissimilarly to the construction of the ordinary flash memory. The select circuit 8 outputs a plurality of column select signals of different pulse widths inputted parallel from the measurement use write pulse generator circuit 9 to the gates of the column select transistors YS1, YS2, YS3, . . . , YSn during pulse width measurement and outputs only one column select signal inputted from the Y-decoder 2 to the column select transistor during the normal memory access.

Also, in the present embodiment, the measuring method and the determining method of the pulse width of the write signal are executed similarly to the description provided with reference to the flowchart of FIG. 3 except that the processing is executed not in columns but in rows.

That is, the threshold values of the memory cells $M_{11}$, $M_{12}$, $M_{13}$, . . . , $M_{1n}$ located on the identical row are adjusted to Vt0 in step S1 by extracting or injecting electrons from or into the floating gate depending on whether a read current from each memory cell is larger than a current value corresponding to the threshold value Vt0.

Figure 6:
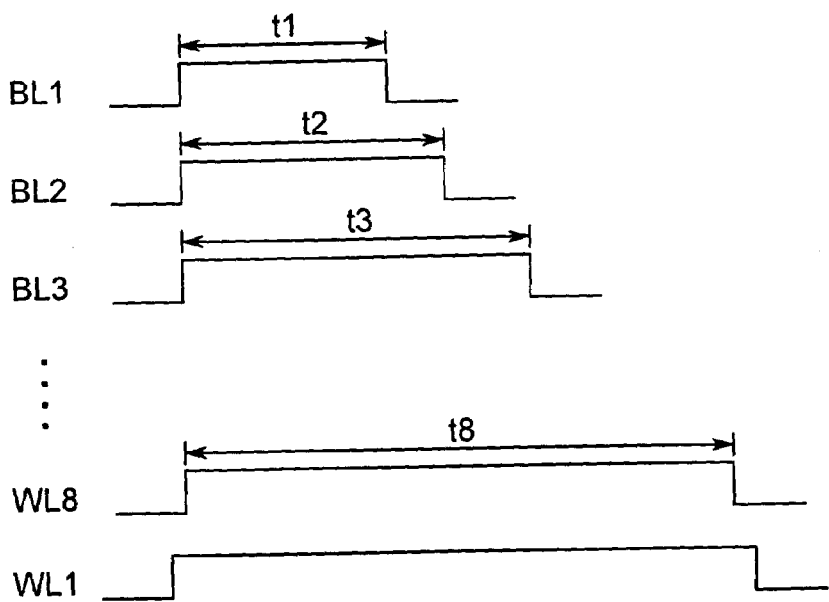
FIG. 6 is a signal timing chart of the write operation of the second embodiment.

Next, when write pulses of different pulse widths are applied to the memory cells $M_{11}$, $M_{12}$, $M_{13}$, . . . , $M_{1n}$ with the setting of, for example, n=8 in step S2, a positive high voltage (12 V, for example) is applied to the word line WL1 from the X-decoder 1 of FIG. 5, and a positive voltage (6 V, for example) is applied to the data line DL from the write circuit 3. As shown in the timing chart of FIG. 6, the column select signals YG1, YG2, . . . , YG8 of different pulse widths t1, t2, . . . , t8 are applied to the gates of the column select transistors YS1, YS2, YS3, . . . , YS8 from the measurement use write pulse generator circuit 9 via the select circuit 8. Then, there appear the same bit line signals as those shown in FIG. 6 on the bit lines BL1, BL2, BL3, . . . , BL8 by the column select transistors YS1, YS2, YS3, . . . , YS8 that are made conductive according to the respective pulse widths. The bit line signals BL1, BL2, BL3, . . . , BL8 rise at the same time as illustrated, whereas the pulse width is gradually increased according to a relation of t1<t2< . . . <t8.

The reason why the bit line signals BL1, BL2, BL3, . . . , BL8 are made to rise in voltage at the same time is to efficiently execute write in the memory cell on the identical row within a short time. Since a large write current is needed for the above operation, it is preferable to externally supply the write current.

The verify operation in step S3 is to convert a current flowing through each bit line into a voltage by means of a resistor element (not shown) when the determination use threshold value is set at Vt0+ΔVt0, the word line WL1 is raised in voltage according to the word line signal from the X-decoder 1 of FIG. 5, a power voltage is supplied to the bit lines BL1, BL2, BL3, . . . , BL8, and the column select transistors YS1, YS2, YS3, . . . , YS8 are made successively conductive via the select circuit 8 according to the column select signal from the Y-decoder 2, compare the resulting voltage with a reference voltage corresponding to the determination use threshold value Vt0+ΔVt0 and output the result of comparison from the sense amplifier circuit 4.

Table 3 shows one example of the data outputted from the sense amplifier circuit 4 that detects each current flowing through the data line DL when the memory cells $M_{11}$, $M_{21}$, . . . $M_{18}$ are successively made conductive.

TABLE 3

| Memory Cell | $M_{11}$ | $M_{21}$ | $M_{31}$ | $M_{41}$ | $M_{51}$ | $M_{61}$ | $M_{71}$ | $M_{81}$ |
|---|---|---|---|---|---|---|---|---|
| Data | "1" | "1" | "1" | "1" | "0" | "0" | "0" | "0" |
| Pulse Width | t1 | t2 | t3 | t4 | t5 | t6 | t7 | t8 |

Table 3 shows that the memory cell $M_{51}$ that has undergone write with the pulse width t5 and the subsequent memory cells have reached the determination use threshold value.

This corresponds to the operation as follows. It is determined whether or not the data read from the memory cell $M_{1k}$ (1≦k≦8) is "1" in steps S4 and S5 of the flowchart of FIG. 3, where the direction of column is read as the direction of row. When the written state, which is represented by "0" counter to "1", is initially attained, the write pulse width of the memory cell is made to be the first-time write pulse width tp1 described with reference to FIG. 1B in step S6.

The first-time write pulse width obtained by the measuring method and the determining method, which have been described above, is applied to the practical write operation as follows and remarkably reduces the write time in comparison with the conventional case. That is, the obtained optimum pulse width is stored in the nonvolatile storage region constructed of nonvolatile memory cells or the like. If the write operation is instructed under the control of an external CPU (Central Processing Unit) or the like, then the write and verify operations are repeated until the prescribed threshold value is attained as described referring to FIG. 1B with the first-time write pulse that has the aforementioned optimum pulse width.

When applying the first-time write pulse, it is executed to read the optimum pulse width from the nonvolatile storage region or to use the nonvolatile storage region itself as an initial setting register and control the pulse width by clock means such as a timer circuit using this value as an initial value. The second and subsequent pulse width setting can be achieved by the conventional method so long as the use of the method does not deviate from the purpose of shortening the write time.

It is to be noted that the nonvolatile semiconductor storage devices, represented by the flash memory, include those which have a programmable control circuit for controlling the entire memory. Therefore, the pulse width measuring and determining processing described in the present invention as well as the write pulse applying with the determined pulse width can be executed on the basis of a program by the control circuit. By so doing, there is an advantage that cost reduction can be achieved with the modification and addition of circuits suppressed to a minimum.

Moreover, it is needless to say that the present invention is not limited to the aforementioned embodiments.

As is apparent from the above description, in the nonvolatile semiconductor storage device constructed of a plurality of memory cells selected by the X-decoder and the Y-decoder that generate the row address and the column address, the pulse width measuring method of the present invention is the method of writing data with the pulse width varied into the plurality of memory cells before the data are written into the memory cells and comparing the threshold voltage of each memory cell with the prescribed reference voltage, and therefore, the measuring time can be shortened. The pulse width determining method of the present invention is the method of obtaining the first write time for bringing the threshold voltages of all the memory cells closest to the reference voltage according to the write times of the memory cells that have threshold voltages lower or higher than the reference voltage by the pulse width measuring method, setting the pulse width as the first-time write pulse width and gradually reducing the second and subsequent write pulse widths. Therefore, the total write time can be remarkably shortened by reducing the frequency of repetition of write and verify. Moreover, the write time is not accumulated in comparison with the conventional method of repeating the write and verify many times with a short pulse and obtaining the first-time write pulse width from the cumulative write time, and therefore, the error can be reduced.

Moreover, the pulse width of the write signal is measured every semiconductor storage device, and therefore, the first-time write pulse width can be determined in accordance with the write time characteristic that differs depending on each semiconductor storage device.

Moreover, the nonvolatile semiconductor storage device of the present invention is provided with the pulse generator circuit for enabling the applying of the write signals of different pulse widths and further with the select circuit that forms an output by switchover between the output from the pulse generator circuit during the pulse width measurement and the output from the X-decoder or the Y-decoder during the normal access. Therefore, the total write time can be remarkably shortened by reducing the frequency of repetition of write and verify, and this enables the reduction of the error of the write time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor storage device having an X-decoder for generating a row address for selecting a word line, a Y-decoder for generating a column address for selecting a bit line, and a plurality of memory cells to be selected via the word line and the bit line by outputs of the X-decoder and the Y-decoder, the device comprising:

a pulse generator circuit for supplying a plurality of pulse signals of different pulse widths to a plurality of word lines to decide a longest possible pulse width at first-time write for bringing the memory cells to a target threshold value; and a select circuit for selecting an output from the pulse generator circuit or the output from the X-decoder to supply a signal for driving the word lines.

2. The nonvolatile semiconductor storage device as claimed in claim 1, wherein the pulse generator circuit generates the plurality of pulse signals of different pulse widths in accordance with same timing.

3. The nonvolatile semiconductor storage device as claimed in claim 1, wherein the Y-decoder simultaneously activates a plurality of outputs to supply write pulses to the bit lines selected by the outputs of the Y-decoder.

4. A nonvolatile semiconductor storage device having an X-decoder for generating a row address for selecting a word line, a Y-decoder for generating a column address for selecting a bit line, and a plurality of memory cells to be selected via the word line and the bit line by outputs of the X-decoder and the Y-decoder, the device comprising:
   a pulse generator circuit for generating a plurality of pulse signals of different pulse widths in accordance with same timing to decide a longest possible pulse width at first-time write for bringing the memory cells to a target threshold value; and
   a select circuit for selecting an output from the pulse generator circuit or the output from the Y-decoder to select bit lines.

5. The nonvolatile semiconductor storage device as claimed in claim 1, further comprising a storage region for storing pulse width information and a control circuit for controlling the pulse generator circuit so as to apply a pulse with a pulse width stored in the storage region.

6. The nonvolatile semiconductor storage device as claimed in claim 1, comprising a power supply terminal, which receives an electric power from an external power supply source at least for a period during which the select circuit is selecting the output of the pulse generator circuit.

7. A write signal pulse width measuring method for a nonvolatile semiconductor storage device that has a plurality of memory cells in which threshold voltages are controlled by executing transfer of electric charges to and from a charge storage layer with a write signal or an erase signal comprised of a plurality of pulses applied and data corresponding to the threshold voltages are retained, the method comprising:
   setting the threshold values of a memory cell group comprised of at least part of the plurality of memory cells to a prescribed first threshold value;
   giving write pulses of different pulse widths to the memory cell group; and
   reading individual data of the memory cell group and comparing a current during read with a reference current corresponding to a second threshold value for determination of a relation of threshold magnitude with respect to the second threshold value.

8. The write signal pulse width measuring method as claimed in claim 7, wherein the setting is comprised of applying an erase signal pulse to the memory cell group.

9. The write signal pulse width measuring method as claimed in claim 7, wherein the write pulses of different pulse widths are applied to the word lines connected to the memory cell group.

10. The write signal pulse width measuring method as claimed in claim 7, wherein the write pulses of different pulse widths are applied to the bit lines connected to the memory cell group.

11. The write signal pulse width measuring method as claimed in claim 7, wherein the write pulses of different pulse widths simultaneously start to be applied.

12. The write signal pulse width determining method using the write signal pulse width measuring method claimed in claim 7, wherein the determination of the relation of magnitude is achieved by comparing the read current with the reference current in an ascending order of the pulse width of the applied write signal, and when there is a pulse width of first inversion case of the relation of magnitude or a plurality of inversion cases of the relation of magnitude, determining either one of pulse widths that range from the pulse width of the first inversion case to the pulse width of the last inversion case as a pulse width of a write signal optimum for write operation.

13. The write signal pulse width determining method as claimed in claim 12, wherein the determination of the pulse width is executed before executing the write operation of the nonvolatile semiconductor storage device.

14. The write signal pulse width determining method as claimed in claim 13, wherein the determination of the pulse width is executed in a fabricating and inspecting stages of the nonvolatile semiconductor storage device.

15. The write signal pulse width determining method as claimed in claim 13, wherein the determination of the pulse width is executed in a power-up stage of the nonvolatile semiconductor storage device.

16. A write method for a nonvolatile semiconductor storage device that has a plurality of memory cells in which threshold voltages are controlled by executing transfer of electric charges to and from a charge storage layer with a write signal or an erase signal comprised of a plurality of pulses applied and data corresponding to the threshold voltages are retained, wherein
   the pulse width determined by the pulse width determining method claimed in claim 12 is made to be a pulse width of a write signal to be applied first during write operation.

17. A write method for a nonvolatile semiconductor storage device that has a plurality of memory cells in which threshold voltages are controlled by executing transfer of electric charges to and from a charge storage layer with a write signal or an erase signal comprised of a plurality of pulses applied and data corresponding to the threshold voltages are retained, wherein
   a value obtained by multiplying the pulse width determined by the pulse width determining method claimed in claim 12 by a positive coefficient smaller than one is made to be a pulse width of a write signal to be applied first during write operation.

* * * * *